(12) United States Patent
Woodward

(10) Patent No.: US 9,287,840 B1
(45) Date of Patent: Mar. 15, 2016

(54) PARAMETRIC AMPLIFICATION AND SWITCHED VOLTAGE SIGNALS FOR PROPELLANTLESS PROPULSION

(71) Applicant: James F. Woodward, Anaheim, CA (US)

(72) Inventor: James F. Woodward, Anaheim, CA (US)

(73) Assignee: Space Studies Institute, Mojave, CA (US)

( * ) Notice: Subject to any disclaimer, the term of this patent is extended or adjusted under 35 U.S.C. 154(b) by 128 days.

(21) Appl. No.: 14/475,070

(22) Filed: Sep. 2, 2014

Related U.S. Application Data

(60) Provisional application No. 61/874,208, filed on Sep. 5, 2013, provisional application No. 61/874,225, filed on Sep. 5, 2013.

(51) Int. Cl.
*B64G 1/40* (2006.01)
*H03F 7/00* (2006.01)

(52) U.S. Cl.
CPC ........................................ *H03F 7/00* (2013.01)

(58) Field of Classification Search
CPC .................................. H03F 7/00; B64G 1/40
USPC .......................................................... 244/171.5
See application file for complete search history.

(56) References Cited

U.S. PATENT DOCUMENTS

| | | | | |
|---|---|---|---|---|
| 5,280,864 A * | 1/1994 | Woodward | ............... | B64G 1/66 244/62 |
| 6,098,924 A * | 8/2000 | Woodward | ............. | B64G 1/409 244/171.5 |
| 6,347,766 B1 * | 2/2002 | Woodward | ............. | H04R 23/00 244/158.1 |
| 6,745,980 B2 * | 6/2004 | Neff | ...................... | B64C 39/001 244/53 R |
| 2004/0159090 A1 * | 8/2004 | Tavarez | ..................... | F03G 3/00 60/200.1 |
| 2006/0065789 A1 * | 3/2006 | Woodward | ............. | F03H 99/00 244/171.5 |
| 2007/0001541 A1 * | 1/2007 | Baker, Jr. | ............... | B64G 1/409 310/301 |

OTHER PUBLICATIONS

J.F. Woodward, "Making Starships and Stargates: The Science of Interstellar Transport and Absurdly Benign Wormholes," Springer Praxis Books, Chapter 3, pp. 65-86, 2013.

\* cited by examiner

*Primary Examiner* — Justin Benedik
(74) *Attorney, Agent, or Firm* — Stiennon & Stiennon

(57) ABSTRACT

A method of producing accelerations without ejecting any material exhaust which relies on inducing mass fluctuations in conventional electrical circuit components and combining them with a mechanically coupled periodic thrust to produce propulsive forces without the ejection of any propellant. Ferroelectric force transducers, in particular, piezoelectric transducers, are driven by at least two phase-locked voltage waveforms so that the rest mass fluctuation and mechanical excursion needed to produce a stationary thrust are both produced in the transducer itself. Parametric amplification is used to achieve high amplitude, correctly phase-locked voltages of correct frequencies to activate the transducer by the simple addition of a DC voltage to the AC voltage of a single frequency driving signal. The driving voltage waveforms may be pulsed to maximize the thrust and reduce the duty cycle of the active components of the system.

8 Claims, 1 Drawing Sheet

PARAMETRIC AMPLIFICATION AND SWITCHED VOLTAGE SIGNALS FOR PROPELLANTLESS PROPULSION

CROSS REFERENCES TO RELATED APPLICATIONS

This application claims priority from U.S. provisional Application Nos. 61/874,208 and 61/874,225 both filed on Sep. 5, 2013 the disclosures of which are incorporated by reference herein.

STATEMENT AS TO RIGHTS TO INVENTIONS MADE UNDER FEDERALLY SPONSORED RESEARCH AND DEVELOPMENT

Not applicable.

BACKGROUND OF THE INVENTION

Mach's principle and local Lorentz invariance together yield the prediction of rest mass fluctuations in objects that are accelerating and simultaneously undergoing changes in their internal energy states. These rest mass fluctuations, both in principle and in practice, can be quite large and, in principle at least, negative. They suggest that exotic spacetime transport devices may be feasible, the least exotic being "impulse engines", devices that can produce accelerations without ejecting any material exhaust. Such "impulse engines" rely on inducing mass fluctuations in conventional electrical circuit components and combining them with a mechanically coupled pulsed thrust to produce propulsive forces without the ejection of any propellant. One simply pushes on the circuit component in which the rest mass fluctuation is induced when it is more massive than average, and pulls back on the component when it is in a mass reduced state, the result of these actions being a net time-averaged force directed away from the fluctuating rest mass component. This method of producing thrust with force transducers (ferroelectric devices or their magnetic equivalents) attached to resonant mechanical structures is already described in U.S. Pat. Nos. 5,280,864; 6,098,924: and 6,347,766. In the method described therein, and in other published work, ferroelectric force transducers, in particular, piezoelectric transducers, are driven by two (or more) phase-locked voltage waveforms so that the rest mass fluctuation and mechanical excursion needed to produce a stationary thrust are both produced in the transducer itself.

SUMMARY OF THE INVENTION

A method of producing thrusts of the sort already known by simpler means and novel features of that method that facilitate the production of large thrusts. Of the several novel features of this new method, two stand out. One is the use of parametric amplification to achieve high amplitude, correctly phase-locked voltages of correct frequencies to activate the transducer by the simple addition of a constant (DC) voltage to the alternating (AC) voltage of a single frequency driving signal. The second novel method is the use of pulsed AC voltage waveforms. The first Mach effect depends on the rate of change of power [dP/dt], and the largest rate of change is produced in switching transients. So switching the AC signal produces much larger transient thrusts than the continuous application of a simple AC signal. An AC voltage waveform must be used with switching, for switched DC voltages do not produce thrust transients as the rate of change of the power in a transient is both positive and negative, averaging to zero, with DC, whereas it is not with AC.

Aerospace propulsion technology to date has rested firmly on simple applications of the reaction principle: creating motion by expelling propellant mass from a vehicle. A peculiar, overlooked relativistic effect makes it possible to induce large rest mass fluctuations in electrical circuit components. An innovative implementation of this effect is to make engines that accelerate without the expulsion of any material whatsoever. This can be done because when the effect is combined with a pulsed thrust in appropriate circumstances, stationary forces can be produced [Woodward, J. F. (1994) "Method for Transiently Altering the Mass of Objects to Facilitate their Transport or Change their Stationary Apparent Weights" U.S. Pat. No. 5,280,864, U.S. GPO, 25 January; (2012) *Making Starships and Stargates: the Science of Interstellar Transport and Absurdly Benign Wormholes* (Springer Verlag, New York, 2012), esp. chapter 3]. Engines of this sort are achieved without, in the conventional sense, any moving parts. The concepts involved are supported by experimental results already in hand. It is therefore desirable to create methods of configuring components that optimize these devices and increase their practical utility.

As described in the sources just mentioned, and references therein, when a sinusoidal voltage is applied to a stack of ferroelectric crystals, lead-zirconium-titanate for example, like that shown in FIG. 1, the stack, reacting against the reaction mass, expands and contracts periodically, inducing a periodical acceleration of the parts of the stack. If the ferroelectric material is piezoelectric, the mechanical oscillation takes place at the frequency of the applied voltage. If it is purely electrostrictive, then the mechanical oscillation takes place at twice the frequency of the applied voltage, for electrostrictors respond to the square of the applied voltage. And the frequency of a squared sinusoidal signal is twice the frequency of the original sinusoidal signal.

The fact that the internal energy of the ferroelectric is changing due to the electrical charging and discharging of what effectively is a capacitor as the mechanical acceleration (oscillation) takes place causes the rest mass of the ferroelectric material to fluctuate according to:

$$\delta m_o \approx \frac{1}{4\pi G \rho_o c^2} \frac{dP}{dt} \quad (1)$$

Where $\delta m_o$ is the magnitude of the rest mass fluctuation, G Newton's constant of universal gravitation, $\rho_o$ the rest mass density of the material, c the speed of light in vacuum, and P the power involved in the internal energy change. P is proportional to the product of the voltage V across the stack and current i flowing to/from the stack. That is, $$P = \frac{dE_o}{dt} = K'iV \quad (2)$$

where $E_o$ is the proper energy in the stack and $$0 \le K' \le 1 \quad (3)$$

to allow for the fact that not all of the power delivered will be stored as internal energy in the stack. Since current always lags voltage by 90 degrees of phase in a capacitor, we have:

$$V = V_o \sin \omega t \qquad (4)$$

$$i = -i_o \cos \omega t \qquad (5)$$

and, $$P = -K'V_o i_o \sin\omega t \cos\omega t = -\frac{K'V_o i_o}{2} \sin 2\omega t \qquad (6)$$

Differentiating P and substituting into Equation (1), we have, $$\delta m_o \approx \omega K K' V_o i_o \cos 2\omega t \qquad (7)$$

where, $$K \equiv \frac{1}{4\pi G \rho_o c^2} \qquad (8)$$

Now, with the rest mass fluctuation given by Equation (7), if a second voltage signal is applied to the ferroelectric stack at the frequency of the mass fluctuation, and the phase of the resulting force on the stack is zero or 180 degrees, that is, the acceleration resulting from the voltage induced force is:

$$\ddot{x} = \pm 4\omega^2 x_o \cos 2\omega t \qquad (9)$$

where overdots indicate differentiation with respect to time, x is in the direction of the length of the stack, $x_o$ is the length of the stack, and the sign in Equation (9) depends on the phase chosen, then when the product of this acceleration and the mass fluctuation is computed a stationary force results. That product is:

$$\delta m_o \ddot{x} = \pm 4\omega^3 x_o K K' V_o i_o \cos^2 2\omega t \qquad (10)$$

Using the trigonometric identity:

$$\cos 2\omega t = 2\cos^2 \omega t - 1 \qquad (11)$$

Equation (10) can be written as:

$$\delta m_o \ddot{x} = \pm 2\omega^3 x_o K K' V_o i_o (1 + \cos 4\omega t) \qquad (12)$$

Taking the time-average of this force, the time-dependent term on the right hand side vanishes, and, $$\langle \delta m_o \ddot{x} \rangle = \pm 2\omega^3 x_o K K' V_o i_o \qquad (13)$$

When care is taken to ensure that both required accelerations are present in a device, this formalism is sufficient to calculate the thrust expected. However, should there be any doubt about the required accelerations, the formalism below, where the acceleration dependence is treated explicitly can be used. (See also chapter 5 of *Making Starships and Stargates*.)

When devices like that shown in FIG. 1 are run on a very sensitive thrust balance, thrusts like those displayed in FIG. 2 result. Ignoring the switching transients at power-on and power-off, a steady thrust of a few μN accompanies the application of a bit more than 100 W of almost entirely reactive power. (The dissipated power can be estimated by measuring the temperature rise of the device during operation and knowing the specific heats of the materials together with their masses. The temperature of 125 gm of material rises less than a degree C. in these circumstances.)

Operation of these "Mach Effect thrusters" [METs] requires two driving voltage signals, one twice the frequency of the other, with a particular phase relationship. Such signals can be produced by doubling some preferred base signal (by squaring it with a four quadrant multiplier such as the AD 633 chip) and then providing offset and phase adjustment, and using these signals to drive suitable power amplifiers. Or, if one can find ferroelectric materials with strong piezoelectric and electrostrictive responses, devices constructed therefrom can be driven with a single frequency as the electrostrictive response will "automatically" provide the requisite second harmonic mechanical response. (Indeed, the device used to generate the data in FIG. 2 was constructed of such a material and driven with a single frequency voltage signal.) However, a method of producing the desired driving voltages that depends neither on multiple, phase locked, phase adjustable signals, nor the use of special materials with unusual properties would greatly simplify the construction and operation of METs. This invention specifies such a method.

The method of this invention employs the technique of parametric amplification to produce the requisite driving voltages with the correct phase relationship for METs from a single frequency signal. Parametric amplification is the amplification of signals achieved by adjusting a parameter not directly associated with the generation of the amplitude of the signal amplified. In this case, the amplification is achieved by combining a constant voltage, that is, DC voltage with the variable, AC voltage signal. That is, the voltage of Equation (4) becomes:

$$V = V_D + V_A \sin \omega t \qquad (14)$$

where $V_D$ is the magnitude of the DC voltage and $V_A$ the amplitude of the AC signal. Substitution of V given in Equation (14) for that in Equation (4) in the calculation of $\delta m_o$ in the preceding section produces first for the power:

$$iV = -i_o \cos \omega t (V_D + V_A \sin \omega t) \qquad (15)$$

$$iV = -i_o \left( V_D \cos \omega t + \frac{V_A}{2} \sin 2\omega t \right) \qquad (16)$$

Differentiating:

$$\frac{d(iV)}{dt} = \omega i_o (V_D \sin \omega t - V_A \cos 2\omega t) \qquad (17)$$

And Equation (7), with parametric amplification, becomes:

$$\delta m_o \approx K K' \frac{d(iV)}{dt} = \omega K K' i_o (V_D \sin \omega t - V_A \cos 2\omega t) \qquad (18)$$

Parametric amplification produces rest mass fluctuations at both the first and second harmonic frequencies in ferroelectric materials, whereas, without the DC bias voltage of that process, rest mass fluctuations only occur at the second harmonic of the AC driving voltage frequency. Likewise, the DC bias voltage of parametric amplification also changes the acceleration of the materials in the stack that must be multiplied times the mass fluctuation to compute any stationary force generated therein. When one is dealing with piezoelectric materials, should they have strong electrostrictive responses, one can dispense with an independent second harmonic signal to generate stationary forces. This is just an incidental, happy consequence of the property of the material of choice. When one employs the method of parametric amplification, however, purely electrostrictive materials, which would otherwise require the application of two driving voltages (as in the case of piezoelectric materials without strong electrostrictive response), can be driven with a single frequency voltage.

Pure electrostrictors have advantages over piezoelectric ferroelectric materials, as discussed below. They also have a less complicated acceleration response to a single frequency applied AC voltage signal. When this is taken into consideration and the stationary force is computed for electrostrictors with parametric amplification, one finds that:

$$\langle \delta m_o \ddot{x} \rangle = -K''(V_D^2 + V_A^2) \quad (19)$$

where, $$K'' \equiv \omega^3 V_{Ai_o} K_e KK' \quad (20)$$

with $K_e$ the electrostrictive coefficient of the material in meters per volt squared. Equation (19) shows that by adding a DC offset voltage, potentially much larger Mach effect thrusts can be achieved. It is worth noting, though, that this is only possible when an AC voltage is also present. Simple DC voltages, even promptly switched DC voltages, as discussed below, do not produce stationary Mach effect forces.

Piezoelectric ferroelectric materials have more complicated mechanical responses to the composite voltage signals (DC plus AC) of parametric amplification. The rest mass fluctuation of Equation (18) is unchanged. But the acceleration induced in the material, as discussed below, is more complicated. The result is that for piezoelectric ferroelectric materials the counterpart of Equation (19) is:

$$\langle \delta m_o \ddot{x} \rangle = -KK'\omega^3 i_o \left( \frac{V_A V_D}{2} K_p + [V_A^3 + V_A V_D^2] K_e \right) \quad (21)$$

where $K_p$ is the piezoelectric coefficient of the material in meters per volt. This dependence of the Mach effect stationary force on the AC and DC components of the driving voltage signal opens several opportunities for adjustment and control, a few of which are mentioned below.

One other aspect of the invention here disclosed, not directly related to the method of parametric amplification, remains to be mentioned. This is the issue of pulsed driving voltage signals. Examination of FIG. 2 reveals that in addition to the steady thrust (of a few μN) during the application of power at a single frequency and voltage amplitude, large switching transient thrusts are seen when the power is switched on and off. These thrust transients are expected as Mach effects depend on the rate at which the power in the device changes, and promptly switched power produces large surges that both cause large rest mass fluctuations, and large accelerations of the stack material. Note, however, that the applied voltage signal must have an AC component. A switched DC signal will NOT produce large Mach effect thrust transients like those seen in FIG. 2. The reason why is simple. When an AC voltage signal is switched, the power rises from its initial zero value to some non-zero value, whereas, when a DC voltage is switched, the rate at which power is delivered to the stack is first positive as the current to the stack rises, and then negative as current to the stack decreases to zero (notwithstanding that the voltage of the stack may now be some large non-zero value). As a result, with an AC signal, dP/dt has a net non-zero value that may be very large if the rise/fall time is very short, whereas the net value for a switched DC signal is zero over the rise/fall time, no matter how short that time is engineered to be.

This invention consists of two parts. One is the use of parametric amplification of driving voltage applied to stacks of, preferably, ferroelectric materials. The other is the use of switched AC voltage signals, conditioned to optimize the switching transient Mach effects to suit the purpose of the application of the MET to be used.

DESCRIPTION OF THE PREFERRED EMBODIMENTS

The invention is described below in further detail in terms of two non-limiting and purely illustrative examples by reference to the scientific basis in observation, theory, and experiment on which rests not only the illustrative examples just mentioned, but also the full range of useful application of the invention and by reference to the annexed drawings.

Figure 1:
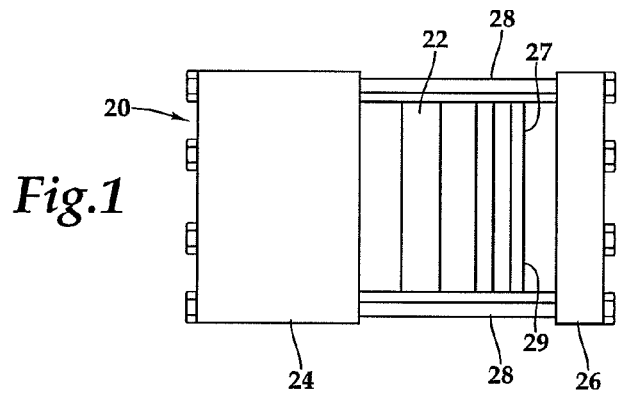
FIG. 1 is a schematic drawing of a propellantless thruster.

Referring more particularly to FIG. 1, a Mach effect thruster 20 is shown in which a stationary thrust can be produced by applying an alternating voltage to a stack of ferroelectric crystals 22 of one suitable frequency while at the same time applying a synchronous alternating voltage with twice the frequency of the first applied voltage with a phase relationship to the first applied voltage so that the acceleration induced by the second voltage to accelerate in one direction when the mass of the stack is increased by the first voltage, and in the opposite direction when the mass of the stack is decreased by the first voltage, resulting in a stationary force along the axis of the stack. The stack of ferroelectric crystals 22 is held clamped between a brass disk 24 and an aluminum cap 26 held together by a plurality of stainless steel bolts 28. An accelerometer 29 and a temperature sensor 27 is incorporated within the stack 22.

Figure 2:
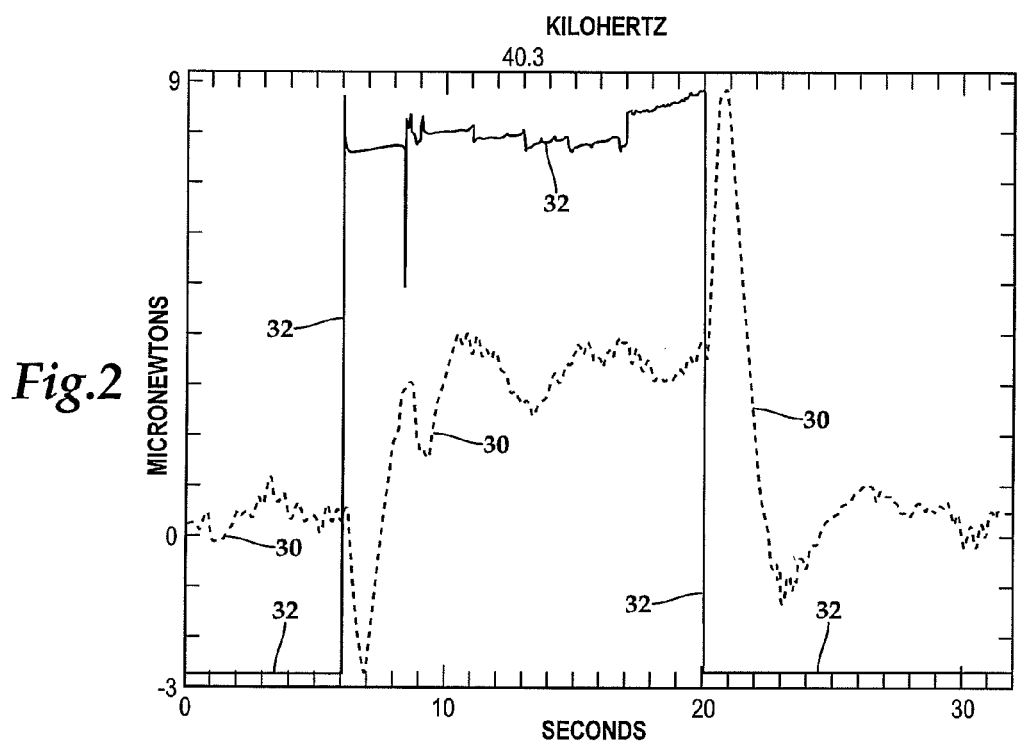
FIG. 2 is a graph of data obtained with the thruster of the type shown in FIG. 1

As shown in FIG. 2 a display of averaged data obtained with a MET like that shown in FIG. 1 when a 14 second pulse of constant frequency, constant power was applied to the device mounted on a sensitive thrust balance with the MET facing first in one direction and then the other, the averages for the two different directions being differenced so as to cancel all "thrusts" that do not reverse with the reversal of the direction of the MET, insuring that only thrusts produced in the MET remain in the display, where the thrust trace is shown as a dashed line 30 and the power trace is a solid line 32, and in addition to the constant thrust during the 14 second interval one notes the switching transients that occur when the power is turned on and then off.

Figure 3:
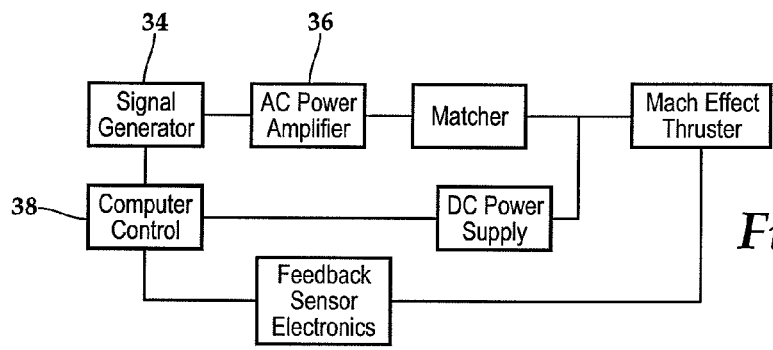
FIG. 3 is a block diagram of the electrical components used in the operation of the thruster of FIG. 1

A block diagram of the electronics components needed to implement the method of the invention is shown in FIG. 3 consisting of a computer controlled signal generator 34 to produce an alternating voltage and an amplifier 36 to give that signal adequate power, a power transformer to isolate the AC power supply from any bias voltage which may be supplied to the MET, a computer controlled constant voltage (DC) power supply to provide the steady bias voltage needed for parametric amplification of the AC power signal, and electronics to process the signals from passive sensors 27, 29 attached to the MET that detect the temperature and acceleration of the parts of the MET, among other properties that might be measured, that are fed back to the control computer 38 so that the driving voltages can be adjusted for optimum performance.

As shown above, when a DC biasing voltage is added to an AC voltage applied to a MET, the resulting rest mass fluctuation is parametrically amplified:

$$\delta m_o \approx KK' \frac{d(iV)}{dt} = \omega KK' i_o(V_D \sin \omega t - V_A \cos 2\omega t) \quad (18)$$

And we see that the effect of parametric amplification, as far as the rest mass fluctuation is concerned, is to produce a mass fluctuation at the frequency of the applied voltage signal with an amplitude determined by the magnitude of the DC bias voltage, in addition to the double frequency term normally produced. To take advantage of this additional rest mass fluctuation, the material in which the effect is produced—preferably a ferroelectric substance because of the high dielectric constants of such substances—must produce a periodic acceleration at the frequency of the applied voltage, and that signal must have the correct phase relationship to the induced rest mass fluctuation.

Essentially all materials, to at least some small extent, display the property of electrostriction with its dependence on the square of the applied voltage. Those materials that display electromechanical effects that depend linearly on the applied voltage, piezoelectrics, are a special class of materials. Since the mass fluctuation contained in Equation (18) is derived without any constraint on the type of material used, one may reasonably ask if the first harmonic term is really present, because a mechanical acceleration is required to produce Mach effects, and if the material is not piezoelectric, a first harmonic acceleration may not be present in the first place to produce the rest mass fluctuation.

It is worth noting that the questionable term vanishes if the DC bias voltage is zero. So we ask: does a DC bias voltage added to an alternating (AC) voltage produce an acceleration that depends on the first harmonic even if the material acted upon does not otherwise respond to the first harmonic of the applied AC voltage? We will need this result in any event to compute any Mach effect thrusts produced in METs. We write the length of the stack of a MET as:

$$x = x_o + K_p V + K_e V^2 \quad (22)$$

where the symbols have their already introduced definitions. Linear voltage response can always be suppressed by setting $K_p$ equal to zero. If we take the mass of the reaction mass in FIG. 1 as effectively infinite, we can compute the velocity of the end of the stack distant from the reaction mass by taking the time-derivative of x, getting:

$$\dot{x} = \omega K_p V_A \cos \omega t + \omega K_e (2V_A V_D \cos \omega t + V_A^2 \sin 2\omega t) \quad (23)$$

where V as given in Equation (14) has been used. The acceleration of the end of the stack is just the time-derivative of Equation (23):

$$\ddot{x} = -\omega^2 K_P V_A \sin \omega t + 2\omega^2 K_e V_A(-V_D \sin \omega t + V_A \cos 2\omega t) \quad (24)$$

Deviations from the ideal circumstances assumed can be absorbed into the coefficient K'. Setting $K_p=0$ to suppress linear voltage response leaves the second term on the right hand side of Equation (24), and that term contains a term that depends on the first harmonic of the applied voltage signal, as required to produce a first harmonic rest mass fluctuation, as in Equation (18).

For our first illustrative example of the method of parametric amplification, we retain the full generality of Equation (22) in computing the Mach effect thrust expected in a generic MET. That thrust is:

$$\delta m_o \ddot{x} = KK' \omega i_o(V_D \sin \omega t - V_A \cos 2\omega t) \times [-\omega^2 K_p V_A \sin \omega t + 2\omega^2 K_e V_A(-V_D \sin \omega t + V_A \cos 2\omega t)] \quad (25)$$

Carrying out the multiplications and simplifying:

$$\delta m_o \ddot{x} = KK' \omega^3 i_o[-V_A V_D(K_p + 2V_D K_e)\sin^2 \omega t + V_A^2(K_p + 4V_D K_e)\sin \omega t \cos \omega t - 2V_A^3 K_e \cos^2 2\omega t] \quad (26)$$

The term in the product of the sine and cosine has no time-independent part, so when the time-average of this thrust expression is taken, it vanishes. The terms in the squares of the sine and cosine, however, via trigonometric identities like that in Equation (11) do have time-independent parts. So, when the time-average of Equation (26) is taken, we find that:

$$\langle \delta m_o \ddot{x} \rangle = -KK' \omega^3 i_o \left( \frac{V_A V_D}{2} K_p + [V_A^3 + V_A V_D^2] K_e \right) \quad (21)$$

Note that whereas the sign of the second term in Equation (21) cannot be changed by changing the polarity of $V_D$ as it is squared, the sign of the first term can be changed by changing the polarity of $V_D$. This means that these two terms can either complement each other, or compete with each other depending on the polarity of the DC bias voltage applied.

The second illustrative example is a simple extension of the first illustrative example for the case where the material of the stack has no piezoelectric properties. In this case, $K_p=0$, and with a little algebraic simplification, Equation (21) becomes:

$$\langle \delta m_o \ddot{x} \rangle = -KK' K_e V_A \omega^3 i_o(V_A^2 + V_D^2) \quad (27)$$

which is the equivalent of Equations (19) and (20) above. As mentioned above, materials with only an electrostrictive response have advantages over piezoelectric materials. Perhaps the most important property is that, since they are non-polar materials in the first place, they cannot be de-poled by operation at temperatures exceeding the Curie temperature of the material. If the performance of the material is degraded by operation at elevated temperatures in harsh environments, their performance can often be restored simply by letting them cool off. There are two obvious disadvantages of pure electrostrictors. One is that the electrostrictive coefficient, $K_e$, for most materials is very small, making very large voltages needed to produce even modest electromechnical effects. The second, evident from Equation (27), is that the thrust is insensitive to the polarity of the DC bias voltage applied as that voltage is squared, so thrust manipulation cannot be achieved by the simple technique of reversing the polarity of the DC voltage that is possible for materials with linear voltage response.

Use of the electrical power [iV] in the expression for the mass fluctuation opens the possibility that the acceleration upon which the fluctuation depends may not be present in some particular device, especially when single frequency operation is to be employed. To preclude this possibility, an equivalent formalism can be used where the acceleration dependence is included explicitly. This is done by noting that when an external force is applied to an object, $$dE = F \cdot ds \quad (28)$$

Where dE is the increment of energy produced when a force F acts through a spatial increment ds. Completing the differentials, we have:

$$P = dE/dt = F \cdot v \quad (29)$$

And, $$dP/dt = F \cdot a = m_o a^2 = m_o \ddot{x}^2 \quad (30)$$

(See chapter 5 of *Making Starships and Stargates*). When this result is substituted into Equation (1), Equation (12) becomes:

$$\delta m_o \ddot{x} = KK' m_o \ddot{x}^3 \quad (31)$$

To compute the cube of the acceleration, we use Equations (14) and (22). Keeping only the time-independent terms in that expression produces:

$$\langle \ddot{x}^3 \rangle = -2K_e V_A^4 \omega^6 (K_p^2 + 4V_D^2 K_e + 2V_D K_p K_e) \quad (32)$$

And the time-averaged force is:

$$\langle F \rangle = -2KK'K_e m_o V_A^4 \omega^6 (K_p^2 + 4V_D^2 K_e + 2V_D K_p K_e) \quad (33)$$

This is the equation that governs devices driven by a single frequency voltage signal allowing for parametric amplification with a DC voltage and the possible presence of both piezoelectric and electrostrictive responses. Note that this equation differs from the earlier equations for the averaged force in that the electrostrictive coefficient $K_e$ is a multiplier of all terms on the right hand side. This means that if electrostriction is absent, a time-averaged force cannot be produced, no matter how the other parameters are varied. Note too that the same condition obtains for the amplitude of the AC voltage signal. No AC voltage, no thrust.

We turn now to the second part of this disclosure: the issue of switched power, or equivalently, pulsed thrust. Simple inspection of FIG. 2 shows that large thrust transients accompany the production of stationary Mach effect thrusts. The thrust data displayed in FIG. 2 was obtained with a very sensitive thrust balance (capable of discriminating thrusts of a tenth of a μN with reasonable signal averaging). Nearly critically damped, the balance had a response time to a stepped signal of about 2 seconds (as can be ascertained by inspection of the thrust transients in FIG. 2). The switching time for the power signal, however, was much shorter, on the order of a millisecond or two. The balance, thus, acted as a ballistic pendulum as far as the thrust transients were concerned. And the thrust pulses of several μN shown were actually produced by forces of several mN acting for a millisecond or two.

From elementary mechanics, we know that the relationship between force, impulse, and momentum is:

$$I = \int F \cdot dt = \int ma \cdot dt = \Delta mv \quad (34)$$

Where I is the impulse delivered by the force F in some short interval resulting in a change in momentum Δmv of the object acted upon. Normally, one would not expect large thrust transients to arise simply from switching the power to a thruster on and/or off, for the mass being acted upon by the force is taken to be constant. In a MET, however, this assumption is false. During the transient, the power to the MET changes rapidly from one value to another, and Equation (1) tells us that:

$$\delta m_o \approx \frac{1}{4\pi G \rho_o c^2} \frac{dP}{dt} \quad (1)$$

So during the transient, the effective restmass of the object acted on can become very much larger or smaller (depending on the sign of dP/dt) than its normal, quiescent value.

Since we are talking about transients here, the mathematics of stationary operation used to compute the effects of DC biasing voltages above are inapplicable. Switching transients introduce higher harmonics of the base switching frequency, responsible for the Mach effects involved, that depend on the details of the switching procedure. Those exceed the scope of the basic claim here. The physics involved, though, can be seen by rewriting Equation (1) in terms of the acceleration dependence implicit in the power. This is done in Chapter 5 of *Making Starships and Stargates*, pp. 174-175, where one finds that:

$$\delta m_o \approx \frac{1}{4\pi G \rho_o c^2} \frac{dP}{dt} \approx \frac{1}{4\pi G \rho_o c^2} F \cdot a = \pm \frac{1}{4\pi G \rho_o c^2} m_o a^2 \quad (35)$$

where the sign of the final expression in this equation depends on the sign the dot product in the intermediate expression, or the sign of dP/dt. From Equation (35) it is evident that m in Equation (34) can be very much larger or smaller if the device where the force is produced is a MET, for in addition to the quiescent mass, a mass fluctuation depending on the square of the acceleration produced by the switching will transiently be present.

The presence of large switching transient thrusts combined with the frequency dependence of Mach effects suggests that the optimum mode of operation of a MET is pulsed high frequency voltage with the pulse profile modulated to maximize thrust in one direction, with a pulse repetition rate commensurate with sustainable duty cycles. The physical properties of materials place restrictions on the optimum values of some parameters involved. For example, METs depend on the oscillatory excursions of the massive ionic constituents of the materials acted upon. This limits the operating frequencies of these devices to about 3 GHz. For above that frequency the ions in material cease to respond strongly to applied oscillatory electric fields and the predominant response becomes electronic.

For the pulsed thrust technique to work, the full conditions of stationary behavior must be established in each pulse. This means that each pulse must be of sufficient duration for that condition to obtain. So with a primary frequency of a few GHz, the pulse widths will likely have to be at least a μsec. or two. To keep the duty cycle modest, a pulse repetition rate of 500 to 1000 Hz seems reasonable.

Thrust developed in any small device will also be small. So, to achieve large thrusts, arrays of such devices will be needed. The use of arrays of METs, rather than single large devices, has the advantage that should one of the devices fail for whatever reason, the operation of the ensemble will not be seriously compromised. Moreover, with the provision of feedback (see FIG. 3) from each MET in an array, detection of failure and identification of the failed MET is possible, making replacement easy as the array need not be externally mounted on the craft to be propelled. All that is needed for failure detection is so-called "open loop" feedback as the information fed back does not result in immediate corrective action on the driving voltage waveform or other associated physical system (for example, active cooling of the METs). For those functions, so-called "closed loop" feedback is required. The use of both forms of feedback are encompassed by this disclosure.

I claim:

1. A method of producing thrust without the irreversible ejection of material propellant, comprising:
    applying time-varying (AC) electromagnetic fields to an electrostrictive material or a magnetostrictive material in such a way that internal energies change as portions of the electrostrictive material or the magnetostrictive material are accelerated;
    wherein the electrostrictive material or the magnetostrictive material is accelerated by the applied time-varying (AC) electromagnetic fields, producing positive and negative fluctuations in the rest mass of the electrostrictive material or the magnetostrictive material;

wherein the time-varying (AC) electromagnetic fields act upon the electrostrictive material or the magnetostrictive material with an accelerating periodic force with a frequency and phase so that the electrostrictive material or the magnetostrictive material is always accelerated by the accelerating periodic force in one direction when the mass fluctuation is positive, and in an opposite direction when the mass fluctuation is negative to produce net thrust over at least one cycle of the applied time-varying (AC) electromagnetic fields;

adding a stationary (DC) voltage to the time-varying (AC) voltage to create a greater thrusting force than with the applied time-varying (AC) electromagnetic fields alone; and wherein the electrostrictive material or the magnetostrictive material is energized at a first frequency, and the accelerating periodic force is at a second frequency which is twice the first frequency.

2. The method of claim 1 wherein the electrostrictive material or the magnetostrictive material is made of ferroelectric or ferromagnetic material.

3. The method of claim 1 wherein the electrostrictive material or the magnetostrictive material is a structure of ferroelectric or ferromagnetic crystals to which said time-varying (AC) electromagnetic fields and said stationary (DC) voltage are applied, said crystals having a linear as well as quadratic responses to the applied fields.

4. The method of claim 1 further comprising measuring at least one property of the electrostrictive material or the magnetostrictive material.

5. The method of claim 4 wherein the property of the electrostrictive material or the magnetostrictive material measured is acceleration or temperature of the electrostrictive material or the magnetostrictive material.

6. The method of claim 1 further comprising providing the electrostrictive material or the magnetostrictive material with sensors which facilitate their operation, said sensors providing feedback, both open and closed loop, said closed loop feedback being employed to actively manage the operating conditions of the electrostrictive material or the magnetostrictive material.

7. The method of claim 1 wherein the AC electromagnetic fields applied to the electrostrictive material or the magnetostrictive material are periodically switched to generate pulsed thrust.

8. The method of claim 7 wherein switching transients caused by turning the AC electromagnetic fields on and off are modulated so that thrust transients produced in one direction are not cancelled or significantly reduced by thrust transients generated in the opposite direction.

* * * * *